United States Patent
Spisany et al.

(10) Patent No.: US 7,343,078 B2
(45) Date of Patent: Mar. 11, 2008

(54) PATCH PANELS WITH COMMUNICATIONS CONNECTORS THAT ARE ROTATABLE ABOUT A VERTICAL AXIS

(75) Inventors: Gordon Spisany, Plano, TX (US); Stanley Wright, McKinney, TX (US); Brian Fitzpatrick, McKinney, TX (US); Thomas J. Boucino, Mooresville, NC (US)

(73) Assignee: Commscope Solutions Properties, LLC, Sparks, NV (US)

( * ) Notice: Subject to any disclaimer, the term of this patent is extended or adjusted under 35 U.S.C. 154(b) by 0 days.

(21) Appl. No.: 11/477,706

(22) Filed: Jun. 29, 2006

(65) Prior Publication Data

US 2008/0002937 A1    Jan. 3, 2008

(51) Int. Cl.
*G02B 6/00* (2006.01)
*H01R 33/945* (2006.01)

(52) U.S. Cl. .................. 385/137; 385/76; 385/77; 385/53; 385/101; 385/134; 385/136; 385/139; 439/577

(58) Field of Classification Search .............. 385/53, 385/100, 134, 135, 136, 137, 138, 139, 76, 385/77, 78, 101; 439/577
See application file for complete search history.

(56) References Cited

U.S. PATENT DOCUMENTS

| 2,143,768 | A | 1/1939 | Eichwald .................. 439/557 |
| 2,427,349 | A | 9/1947 | Boynton .................... 439/49 |
| 3,199,068 | A | 8/1965 | Neenan ...................... 439/49 |
| 3,611,264 | A | 10/1971 | Ellis, Jr. .................... 439/99 |
| 4,536,052 | A | 8/1985 | Baker et al. ............ 339/126 R |
| 4,538,868 | A | 9/1985 | Cruise et al. ............... 339/34 |
| 4,747,020 | A | 5/1988 | Brickley et al. .......... 361/428 |
| 4,815,104 | A | 3/1989 | Williams et al. ........... 375/36 |
| 4,824,196 | A | 4/1989 | Bylander ............... 385/135 A |
| 4,832,436 | A | 5/1989 | Goto et al. ............ 385/135 X |
| 4,995,688 | A | 2/1991 | Anton et al. ........... 385/135 X |
| 5,011,257 | A | 4/1991 | Wettengel et al. ..... 385/135 X |
| 5,127,082 | A | 6/1992 | Below et al. ............... 385/135 |
| 5,129,842 | A | 7/1992 | Morgan et al. ............ 439/532 |
| 5,178,554 | A | 1/1993 | Siemon et al. ............ 439/188 |
| 5,204,929 | A | 4/1993 | Machall et al. ............ 385/135 |
| 5,238,426 | A | 8/1993 | Arnett ........................ 439/557 |
| 5,299,956 | A | 4/1994 | Brownell et al. .......... 439/638 |
| 5,302,140 | A | 4/1994 | Arnett ........................ 439/557 |
| 5,303,519 | A | 4/1994 | Mustee et al. ................ 52/35 |

(Continued)

FOREIGN PATENT DOCUMENTS

EP    0 736 937    10/1996    ............. 439/577 X

*Primary Examiner*—Brian M. Healy
(74) *Attorney, Agent, or Firm*—Myers Bigel Sibley & Sajovec

(57) ABSTRACT

A patch panel configured for mounting to a network rack, includes: a frame including mounting features at opposite lateral ends for mounting the patch panel to the network rack; a bezel mounted to the patch panel, the bezel including a plurality of outlet apertures, and a plurality of communication outlets mounted in respective ones of the outlet apertures. Each of the outlets includes a plurality of electrical contacts within a plug aperture configured to receive a mating plug. The plug aperture has a generally horizontal axis for receiving the mating plug and further includes a plug latch recess. The outlets are oriented such that the plug latch recess is positioned on one side edge of the plug aperture.

26 Claims, 6 Drawing Sheets

U.S. PATENT DOCUMENTS

| | | | |
|---|---|---|---|
| 5,310,363 A | 5/1994 | Brownell et al. | 439/676 |
| 5,363,465 A | 11/1994 | Korkowski et al. | 385/135 |
| 5,370,541 A | 12/1994 | Bossard | 439/131 |
| 5,370,553 A | 12/1994 | Zimmerman | 439/534 |
| RE34,955 E | 5/1995 | Anton et al. | 385/53 |
| 5,412,751 A | 5/1995 | Siemon et al. | 385/135 |
| 5,530,954 A | 6/1996 | Larson et al. | 385/135 |
| 5,575,665 A | 11/1996 | Shramawick et al. | 439/49 |
| 5,575,668 A | 11/1996 | Timmerman | 439/131 |
| 5,591,045 A | 1/1997 | Pepe et al. | 439/460 |
| 5,639,261 A | 6/1997 | Rutkowski et al. | 439/534 |
| 5,645,449 A | 7/1997 | Sabo | 439/540.1 |
| 5,659,650 A | 8/1997 | Arnett | 385/135 |
| 5,674,093 A | 10/1997 | Vaden | 439/676 |
| 5,676,566 A | 10/1997 | Carlson, Jr. et al. | 439/636 |
| 5,700,167 A | 12/1997 | Pharney et al. | 439/676 |
| 5,734,776 A | 3/1998 | Puetz | 385/134 |
| 5,735,714 A | 4/1998 | Orlando et al. | 439/676 |
| 5,773,763 A | 6/1998 | Stachulla | 174/135 |
| 5,788,087 A | 8/1998 | Orlando | 211/26 |
| 5,836,786 A | 11/1998 | Pepe | 439/557 |
| 5,892,870 A | 4/1999 | Fingler et al. | 385/59 |
| 5,903,698 A | 5/1999 | Poremba et al. | 385/135 |
| 5,921,402 A | 7/1999 | Magenheimer | 211/26 |
| 5,944,535 A | 8/1999 | Bullivant et al. | 439/49 |
| 5,945,633 A | 8/1999 | Ott et al. | 174/59 |
| 5,947,765 A | 9/1999 | Carlson, Jr. et al. | 439/535 |
| 5,956,449 A | 9/1999 | Otani et al. | 385/134 |
| 5,961,345 A * | 10/1999 | Finn et al. | 439/536 |
| 5,967,836 A | 10/1999 | Bailey | 439/534 |
| 5,969,294 A | 10/1999 | Eberle et al. | 174/57 |
| 5,975,962 A | 11/1999 | Laukonis | 439/713 |
| 5,984,720 A | 11/1999 | Milner et al. | 439/534 |
| 6,146,192 A | 11/2000 | Cabalka et al. | 439/540.1 |
| 6,208,796 B1 | 3/2001 | Williams Vigliaturo | 385/135 |
| 6,231,380 B1 | 5/2001 | Cabalka et al. | 439/540.1 |
| 6,236,795 B1 | 5/2001 | Rodgers | 385/134 |
| 6,242,698 B1 | 6/2001 | Baker, III et al. | 174/72 A |
| 6,468,112 B1 | 10/2002 | Follingstad et al. | 439/719 |
| 6,497,578 B1 | 12/2002 | Kwong et al. | 439/61 |
| 6,537,106 B1 | 3/2003 | Follingstad | 439/534 |
| 6,565,260 B2 | 5/2003 | Belaidi et al. | 385/53 |
| 6,600,106 B2 | 7/2003 | Standish et al. | 174/683 |
| 6,614,978 B1 | 9/2003 | Caveney | 385/135 |
| 6,626,697 B1 * | 9/2003 | Martin et al. | 439/488 |
| 6,711,339 B2 | 3/2004 | Puetz et al. | 385/135 |
| 6,772,887 B2 * | 8/2004 | Audibert et al. | 211/26 |
| 6,866,541 B2 | 3/2005 | Barker et al. | 439/540.1 |
| 6,916,199 B2 | 7/2005 | Follingstad | 439/534 |
| 6,918,786 B2 | 7/2005 | Barker et al. | 439/540.1 |
| 6,974,348 B2 | 12/2005 | Bentley | 439/540.1 |
| 2003/0129871 A1 | 7/2003 | Follingstad | 439/534 |
| 2004/0192094 A1* | 9/2004 | Navarro et al. | 439/188 |
| 2005/0191901 A1 | 9/2005 | Follingstad | 439/534 |

* cited by examiner

PATCH PANELS WITH COMMUNICATIONS CONNECTORS THAT ARE ROTATABLE ABOUT A VERTICAL AXIS

FIELD OF THE INVENTION

The present invention is directed generally to communication connectors, and more specifically to connectors employed with patch panels.

BACKGROUND OF THE INVENTION

Communications cables, such as shielded and unshielded twisted pair cables, coaxial cables, and fiber optic cables, transmit data, voice, video and/or audio information in the telecommunications industry. Network equipment enclosure rack systems are well-known in this industry for managing and organizing such cables as they are routed to and from various destinations.

Rack systems typically include a distribution frame rack on which one or more patch panels, network equipment, fiber optic enclosures and the like are mounted. Rack systems serve various functions, including their use as slack trays, splice trays, cable organizers and patch panels. These rack systems also serve as interconnect or cross-connect enclosures when they interface with equipment. Additionally, rack systems may serve as a telecommunications closet, allowing the cables to be terminated, spliced, patched and/or stored at various places along their length.

The rack is usually formed from a frame having mounting apertures located along the vertical legs or walls of the rack. Patching equipment, such as a patch panel, is mounted onto the rack so as to generally define a patching side, where patch cords from another active device or another patch panel can be cross-connected and interconnected, and a distribution side, where cables from network equipment and/or work station areas are terminated.

Generally, some structures or feature for cable management are provided on both sides of the rack to support and route the cables. With the increasing use of fiber optic connectors as applied to connector rack systems, proper cable management and bend radius control has become increasingly important. Many known systems are unable to provide complete bend radius control, are inefficient, are difficult to manufacture, are difficult to manage and access, and/or have other drawbacks.

One proposed improvement to patch panel design is described in U.S. Pat. No. 6,866,541 to Barker et al. This patent describes a patch panel that defines generally a shallow V-shape (rather than being flat or planar), such that the vertex of the "V" protrudes in front of the rack to which it is mounted. Jacks mounted in the patch panel are mounted flush with the patch panel surfaces so that they are oriented to face outwardly as well as forwardly. Consequently, both plug insertion and cord management may be simplified. One shortcoming of this design is that the extension of the patch panel forwardly of the rack may require additional space.

SUMMARY OF THE INVENTION

As a first aspect, embodiments of the present invention are directed to a patch panel configured for mounting to a network rack. The patch panel comprises: a frame including mounting features at opposite lateral ends for mounting the patch panel to the network rack; a bezel mounted to the patch panel, the bezel including a plurality of outlet apertures; and a plurality of communication outlets mounted in respective ones of the outlet apertures. Each of the outlets includes a plurality of electrical contacts within a plug aperture configured to receive a mating plug. The plug aperture has a generally horizontal axis for receiving the mating plug and further includes a plug latch recess. The outlets are oriented such that the plug latch recess is positioned on one side edge of the plug aperture when the patch panel is mounted on a network rack.

As a second aspect, embodiments of the present invention are directed to a patch panel configured for mounting to a network rack, comprising: a frame including mounting features at opposite lateral ends for mounting the patch panel to the network rack; a bezel mounted to the patch panel, the bezel including a generally planar face plate and a plurality of outlet apertures in the face plate, wherein a plane defined by the mounting features is substantially parallel to the face plate; and a plurality of communication outlets mounted in respective ones of the outlet apertures. Each of the outlets includes a plurality of electrical contacts within a plug aperture configured to receive a mating plug, the plug aperture having a generally horizontal axis for receiving the mating plug. The outlets are oriented such that the horizontal axes of the plug outlet apertures extend at an oblique angle from the face plate.

As a third aspect, embodiments of the present invention are directed to a patch panel configured for mounting to a network rack, comprising: a frame including mounting features at opposite lateral ends for mounting the patch panel to the network rack; a bezel mounted to the patch panel, the bezel including a front face plate with a plurality of outlet apertures and top and bottom panels mounted to the face plate; and a plurality of communication outlets mounted in respective ones of the outlet apertures. Each of the outlets includes a plurality of electrical contacts within a plug aperture configured to receive a mating plug. The plug aperture has a generally horizontal axis for receiving the mating plug and further includes a plug latch recess. The outlets are oriented such that the plug latch recess is positioned on one side edge of the plug aperture and such that the horizontal axis of each plug aperture extends forwardly and laterally away from its respective plug aperture. The top and bottom panels of the bezel include notches that receive therein portions of the outlets.

As a fourth aspect, embodiments of the present invention are directed to a patch panel configured for mounting to a network rack, comprising: a frame including mounting features at opposite lateral ends for mounting the patch panel to the network rack; a bezel mounted to the patch panel, the bezel including a plurality of outlet apertures, and a plurality of communication outlets mounted in respective ones of the outlet apertures. Each of the outlets includes a plurality of electrical contacts within a plug aperture configured to receive a mating plug. The plug aperture has a generally horizontal axis for receiving the mating plug. The outlets are rotatable about a vertical axis between a forwardly-facing orientation and a forwardly- and laterally-facing orientation within the outlet aperture.

DETAILED DESCRIPTION OF EMBODIMENTS OF THE INVENTION

Figure 1:
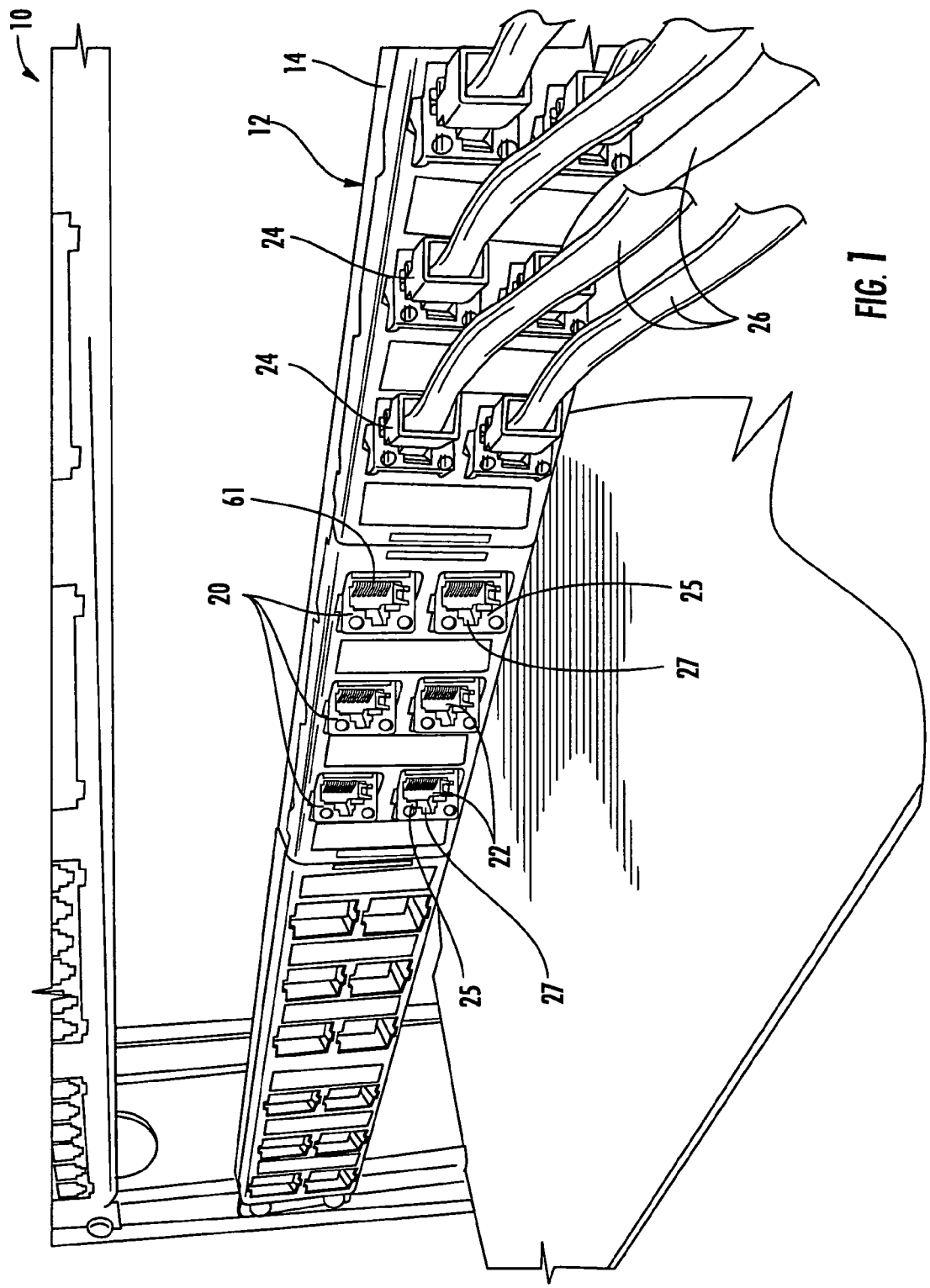
FIG. 1 is a top perspective view of a patch panel according to embodiments of the present invention.

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein the expression "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Where used, the terms "attached", "connected", "interconnected", "contacting", "mounted," "coupled" and the like can mean either direct or indirect attachment or contact between elements, unless stated otherwise. In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Well-known functions or constructions may not be described in detail for brevity and/or clarity.

This invention is directed to a patch panel for communications connectors, with a primary example of such being a communications outlet or jack. As used herein, the terms "forward", "forwardly", and "front" and derivatives thereof refer to the direction defined by a vector extending from the center of the patch panel toward the viewer in FIG. 2. Conversely, the terms "rearward", "rearwardly", and derivatives thereof refer to the direction directly opposite the forward direction; the rearward direction is defined by a vector that extends from the center of the patch panel away from the viewer in FIG. 2. The terms "lateral," "laterally", and derivatives thereof refer to the direction defined by a vector originating at the center of the patch panel and extending normal to a vertical plane that extends through the center of the patch panel toward the viewer in FIG. 2. The terms "medial," "inward," "inboard," and derivatives thereof refer to the direction that is the converse of the lateral direction, i.e., the direction extending from the periphery of the patch panel toward the aforementioned bisecting plane.

Figure 2:
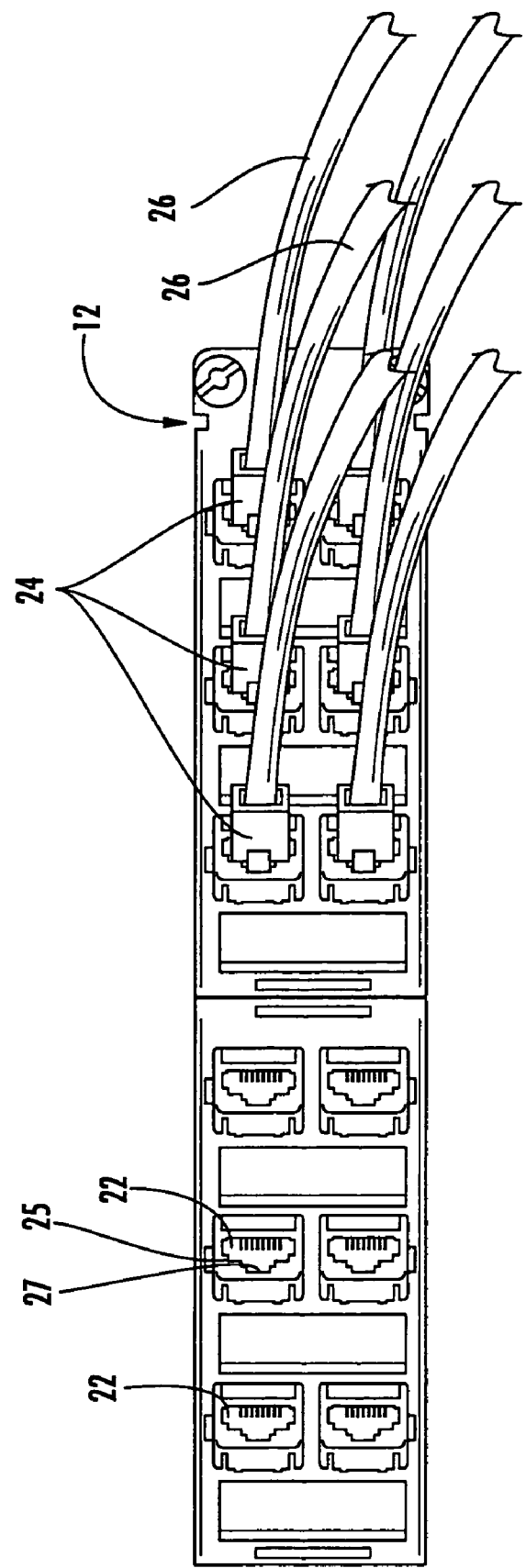
FIG. 2 is a front view of the patch panel of FIG. 1.
Figure 3:
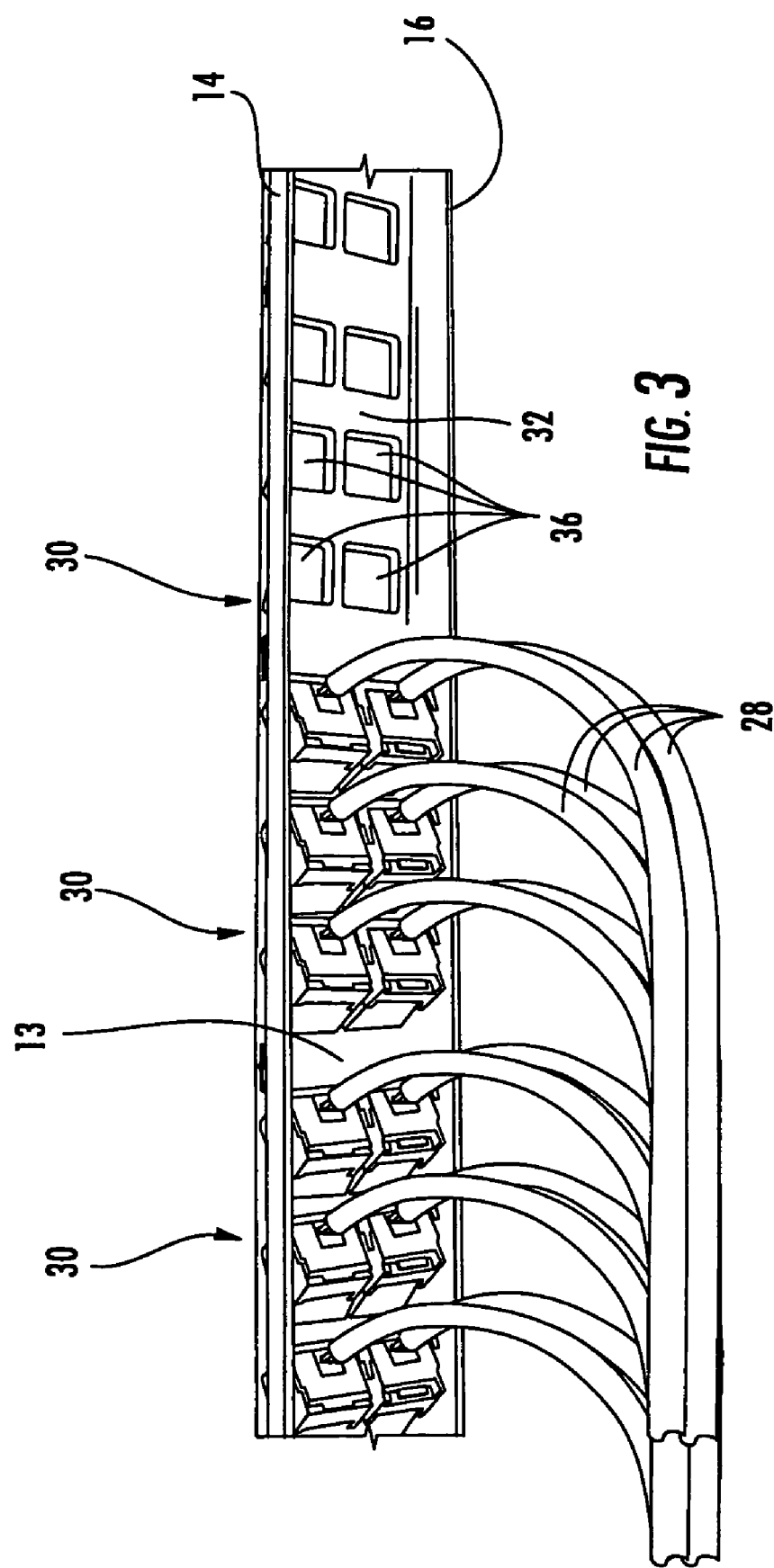
FIG. 3 is a rear perspective view of the patch panel of FIG. 1.

Referring now to the figures, a communications rack assembly, designated broadly at 10, is illustrated in FIGS. 1-3. The exemplary rack assembly 10 includes one patch panel 12, although those skilled in this art will appreciate that typically a communications rack 10 will include multiple patch panels 12. The patch panel 12 is essentially a skeletal frame that in the illustrated embodiment includes a generally planar front panel 13, a top lip 14, a bottom lip 16, and lateral flanges 18 (see FIG. 4) or other mounting features that enable the patch panel 12 to be mounted to the rack assembly 10. The front panel 13 includes openings in which mounting bezels 30 are received. The lateral flanges 18 define a plane P that is substantially parallel with the front panel 13. The patch panel 12 is typically formed of steel or another metal, although in some embodiments other materials may be employed.

Still referring to FIGS. 1-3, the patch panel 12 presents a number of communications outlets 20 mounted in the bezels 30. Each of the outlets 20 has a plug aperture 22 facing generally the "patching" side of the patch panel 12 in which a communications plug 24 is inserted. The plug 24 is attached to a patch cord 26 (see FIGS. 1 and 2). Each plug aperture 24 includes a plug latch recess 27 in a side edge 25 thereof for receiving the snap latch of a standard plug 24. Referring to FIG. 3, a cable 28 is connected to the opposite end of each outlet 20 on the "distribution side" of the patch panel 12. Conventionally, the patch cords 26 are routed from their insertion points with the outlets 20 horizontally along the patching side of the rack 10, and the cables 28 are routed horizontally along the distribution side of the patch panel 12, although this routing scheme can be reversed or modified as desired.

Figure 4:
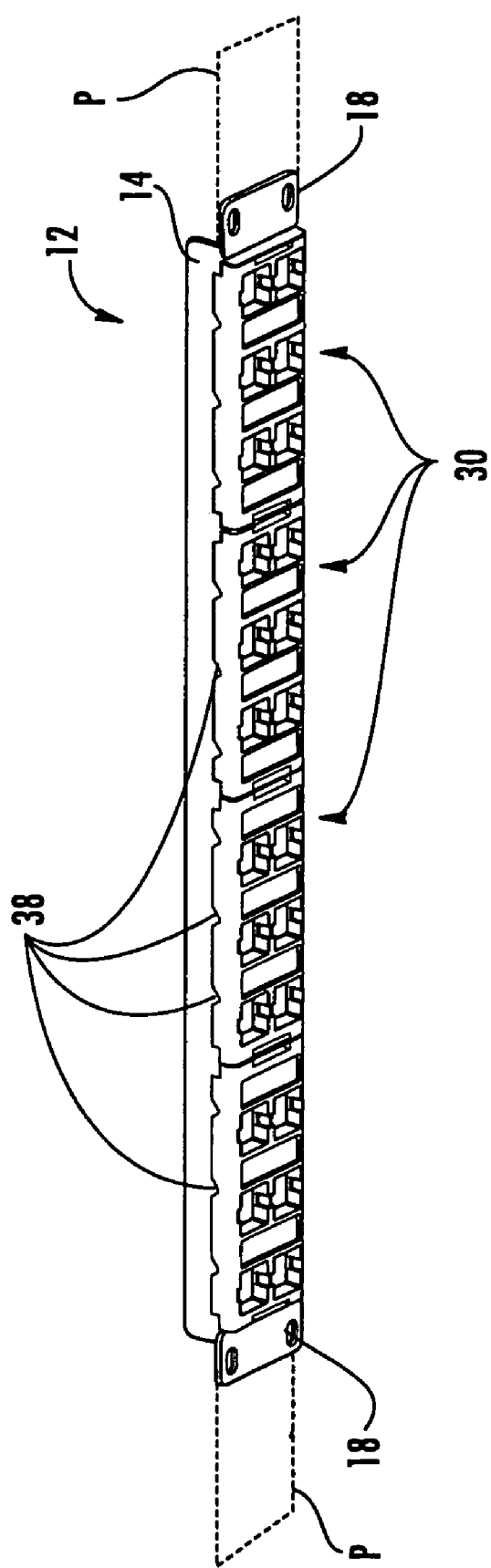
FIG. 4 is a top perspective view of the patch panel of FIG. 1 with outlets removed.
Figure 5:
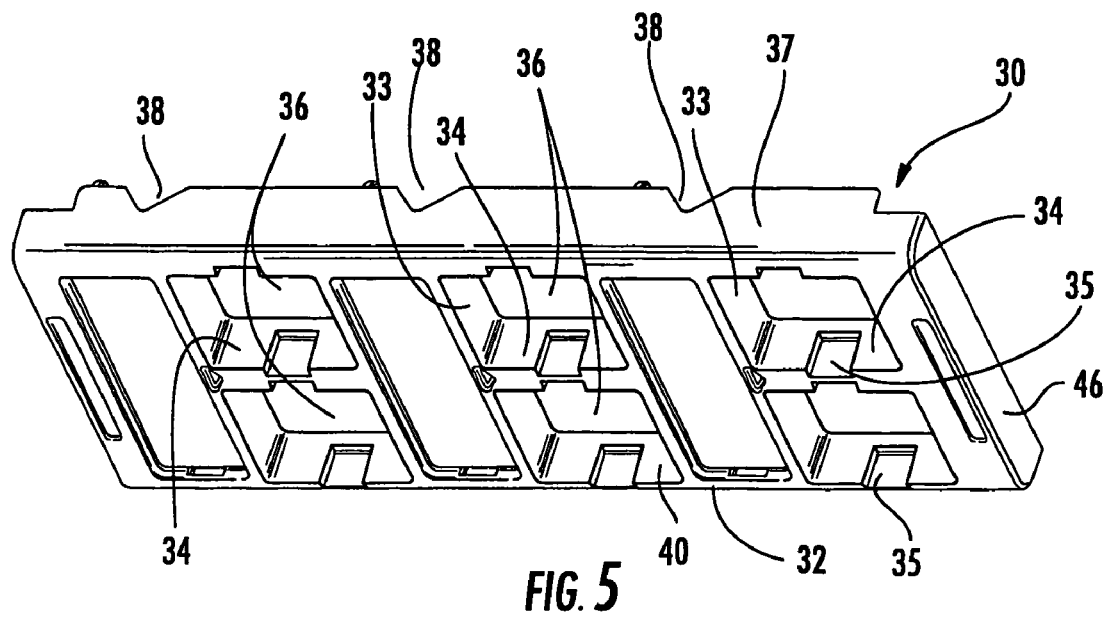
FIG. 5 is a top perspective view of an exemplary bezel of the patch panel of FIG. 1.

Referring now to FIGS. 4 and 5, it can be seen that the patch panel 12 illustrated therein receives four bezels 30, each of which presents mounting locations for six outlets 20 (in two horizontal rows of three outlets 20 in each row), although those skilled in this art will recognize that different numbers of bezels per patch panel, different numbers of outlets per bezel, and different configurations of outlets 20 within a bezel 30 may be employed. FIG. 5 illustrates an exemplary bezel 30. The bezel 30 includes a front face plate 32 with outlet apertures 36, a top panel 37, a bottom panel 40, and side walls 46. Each of the outlet apertures 36 is defined by one of the top or bottom panels 37, 40, one of three horizontal partitions 34, and vertical partitions 33. Each of the horizontal surfaces that defines an outlet aperture 36 (i.e., the horizontal partitions 34, the top panel 37, and the bottom panel 40) includes an engagement recess 35. Also, the top panel 37 includes three notches 38 in its rear edge, each of which is offset medially from a respective upper outlet aperture 36 (see FIGS. 5 and 6); similarly, the bottom panel 40 includes three notches (not visible in FIGS. 5 and 6) in its rear edge that are vertically aligned with the notches 38.

Figure 6:
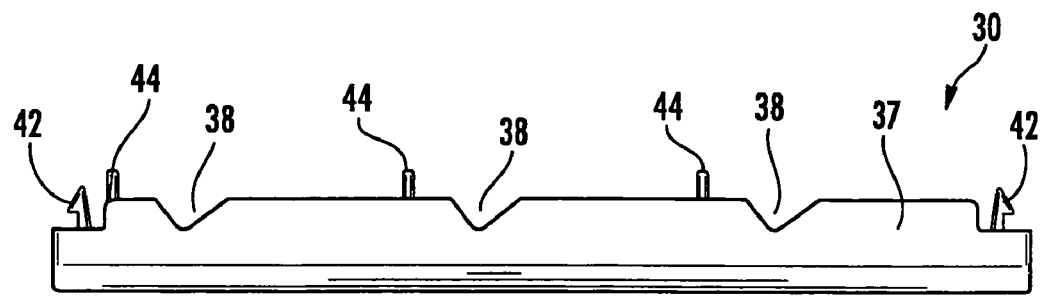
FIG. 6 is a top view of the bezel of FIG. 5.

Referring now to FIG. 6, the bezel 30 includes a pair of latches 42 that extend from the rear surface of the face plate 32 near the side walls 46. These latches 42 engage apertures, recesses or the like (not shown) on the front panel 13 of the patch panel 12 to mount the bezel 30 thereto. The bezel 30 also includes guides 44 that extend rearwardly from the face plate 32 from a medial location adjacent a respective notch 38.

The bezel 30 is typically formed of a polymeric material, such as polycarbonate or a polycarbonate/ABS blend, and is injection-molded. However, the bezel 30 can be formed of other materials known by those skilled in this art to be suitable for this use. In addition, in some embodiments the frame and bezel may be formed as a single unitary member, with the frame providing support and the bezel providing mounting locations for the outlets 20.

Figure 7:
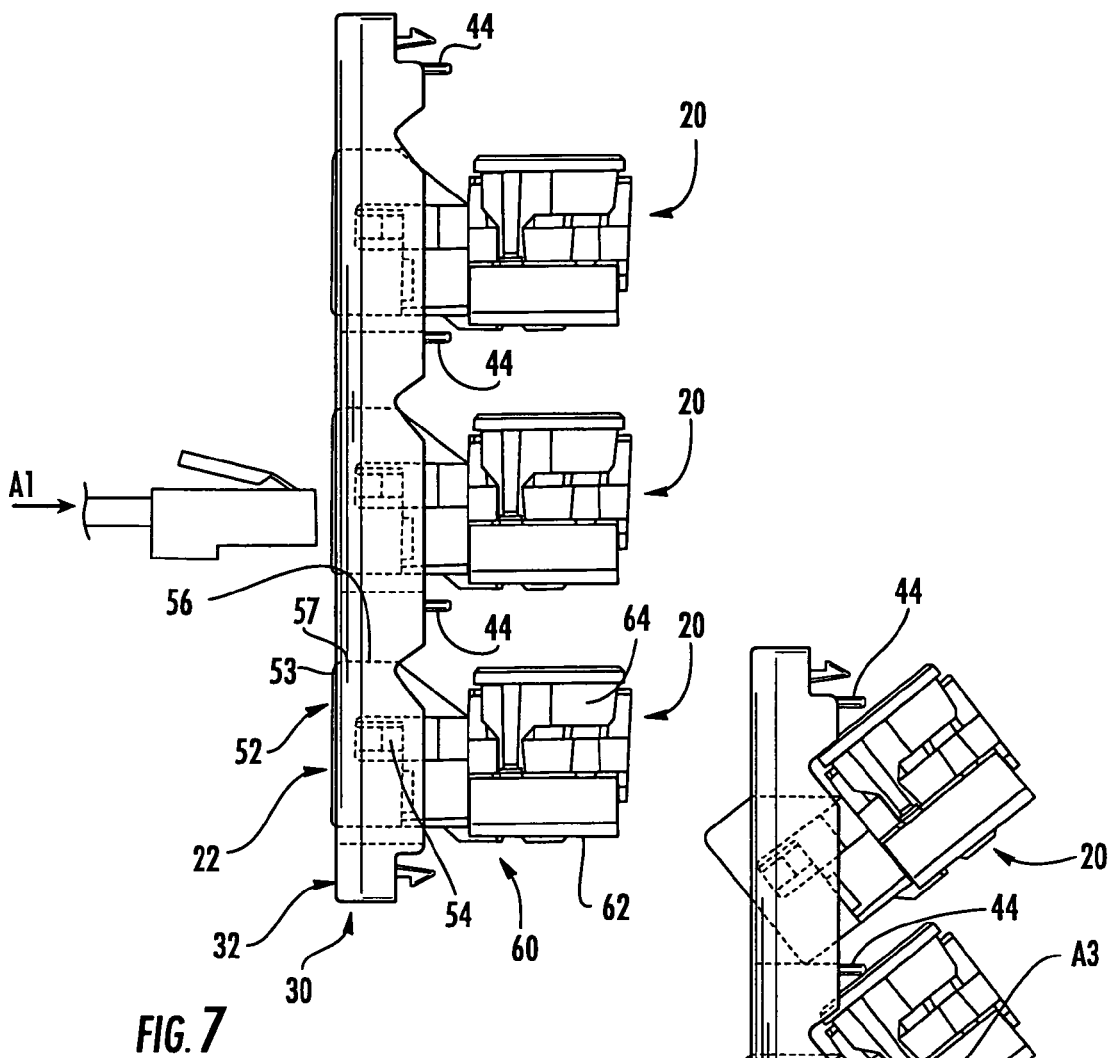
FIG. 7 is a partial, enlarged top view of the bezel of FIG. 6 with an outlet inserted therein and oriented to face forwardly
Figure 8:
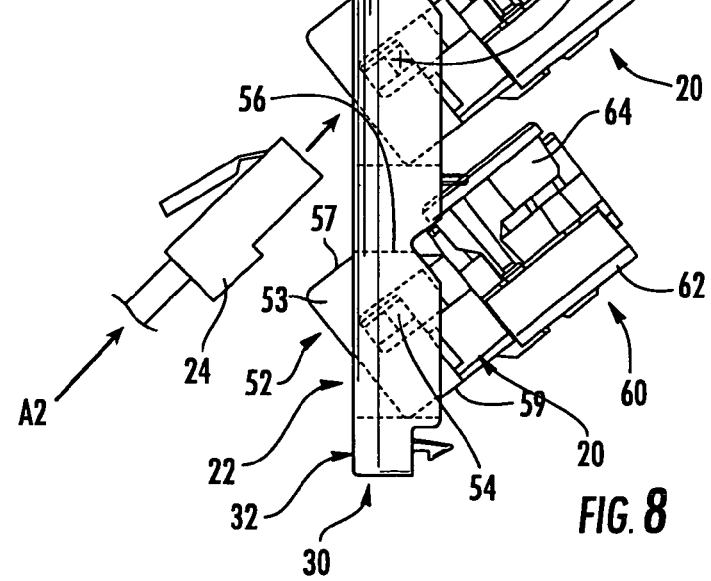
FIG. 8 is a partial, enlarged top view of the bezel of FIG. 5 with an outlet inserted therein and oriented to face forwardly and laterally as shown in FIGS. 1-3.

Referring now to FIGS. 7 and 8, the outlet 20 includes a jack frame 52 and a rear housing 60. The jack frame 52 has a top surface 53 and a bottom surface (not shown), each with latches 54 mounted thereon, and also includes side walls 57, 59. A beveled surface 56 merges with the side wall 57 and extends at an oblique angle thereto (typically this angle is between about 10 and 45 degrees). The jack frame 52 includes the aforementioned plug aperture 22, within which are mounted electrical terminals 61 (see FIG. 1) for mating with the contacts of a mating plug 24.

The rear portion of the jack frame 52 is mounted to the rear housing 60, to which the cable 28 is connected. Typically, the rear housing 60 includes insulation displacement connectors (IDCs) or the like for connecting the individual conductors of the cable 28 to the rear housing 60. Also, ordinarily the electrical terminals 61 that are mounted within the plug aperture 22 are mounted in a wiring board or the like that resides within the rear housing 60. A cover 62 is fixed to one side of the rear housing 60, and another cover 64 is releasably latched to the other side of the housing 60. The cover 64 can be removed during termination of the cable conductors with the IDCs and replaced following termination.

The structure and operation of an exemplary outlet 20 are described in greater detail in U.S. Pat. No. 5,897,395 to Arnett et al, the disclosure of which is hereby incorporated herein by reference in its entirety.

Referring still to FIGS. 7 and 8, the outlet 20 is mounted in an outlet aperture 36 in the bezel 30 such that the top surface 53 and the bottom surface are generally horizontal and the side walls 57, 59 are generally vertical. The outlet 20 is maintained in position by the latches 54 as they engage the engagement recesses 35 in the bezel 30. In the orientation of FIG. 7, the outlet 20 is oriented so that the side walls 57, 59 are substantially perpendicular to the face plate 32 of the bezel 30, such that the plug axis A1 along which the plug 24 enters the plug aperture 22 is perpendicular to the face plate 32. In contrast, in the orientation of FIG. 8, the outlet 20 is oriented such that the beveled surface 56 is generally perpendicular to the face plate 32 of the bezel 30; thus, the plug aperture 22 faces forwardly and laterally at an oblique angle of between about 10 and 45 degrees to the face plate 32 of the bezel 30. Consequently, the horizontal plug axis A2 along which the plug 24 enters the plug aperture 22 is at an oblique angle to the face plate 32 of the bezel 30, and the patch cord 26 attached to the plug 24 naturally extends laterally from the plug 24. In this orientation, portions of the rear housing 60 and/or the cover 64 are received in the notches 38 in the bezel 30 (because the lips 14, 16 of the patch panel 12 are typically thinner than the top and bottom panels 37, 40 of the bezel 30, the lips 14, 16 may not require a notch or recess in order to accommodate the outlet 20; also, in other embodiments, the open notches 38 may be omitted entirely or may be replaced with closed recesses in the panels 37, 40). The guides 44 are positioned to assist with the insertion of the outlets 20 in the bezel 30.

The outlet 20 can be rotated between the orientations of FIGS. 7 and 8 by inserting the outlet 20 in one of the orientations, then rotating the outlet 20 about a vertical axis A3 that passes through the latches 42. Thus, the operator can choose between orientations of the outlet for operations such as conductor termination, plug insertion, cable management, and the like.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

The invention claimed is:

1. A patch panel configured for mounting to a network rack, comprising:
   a frame including mounting features at opposite lateral ends for mounting the patch panel to the network rack;
   a bezel mounted to the patch panel, the bezel including a plurality of outlet apertures; and
   a plurality of communication outlets mounted in respective ones of the outlet apertures, each of the outlets including a plurality of electrical contacts within a plug aperture configured to receive a mating plug, the plug aperture having a generally horizontal axis for receiving the mating plug and further including a plug latch recess, the outlets being oriented such that the plug latch recess is positioned on one side edge of the plug aperture when the patch panel is mounted on the network rack.

2. The patch panel defined in claim 1, wherein the communication outlets are oriented such that the horizontal axis of each plug aperture faces forwardly and laterally.

3. The patch panel defined in claim 2, wherein each outlet includes a jack frame having a side wall with a beveled surface.

4. The patch panel defined in claim 1, wherein each outlet aperture includes an engagement recess on top and bottom edges thereof, and wherein each outlet includes engaging members that engage the engagement recesses.

5. The patch panel defined in claim 1, wherein the bezel includes top and bottom panels, and wherein each of the top and bottom panels includes notches configured to receive portions of the communication outlets.

6. The patch panel defined in claim 1, wherein the outlet apertures are arranged in two parallel rows.

7. The patch panel defined in claim 1, wherein the bezel includes guides that extend rearwardly therefrom.

8. A patch panel configured for mounting to a network rack, comprising:
   a frame including mounting features at opposite lateral ends for mounting the patch panel to the network rack;
   a bezel mounted to the patch panel, the bezel including a generally planar face plate and a plurality of outlet apertures in the face plate, wherein a plane defined by the mounting features is substantially parallel to the face plate; and a plurality of communication outlets mounted in respective ones of the outlet apertures, each of the outlets including a plurality of electrical contacts within a plug aperture configured to receive a mating plug, the plug aperture having a generally horizontal axis for receiving the mating plug, the outlets being oriented such that the horizontal axes of the plug outlet apertures extend at an oblique angle from the face plate.

9. The patch panel defined in claim 8, wherein each outlet includes a jack frame having a side wall with a beveled surface.

10. The patch panel defined in claim 8, wherein each outlet aperture includes an engagement recess on top and bottom edges thereof, and wherein each outlet includes engaging members that engage the engagement recesses.

11. The patch panel defined in claim 8, wherein the bezel includes top and bottom panels, and wherein each of the top and bottom panels includes notches configured to receive portions of the communication outlets.

12. The patch panel defined in claim 8, wherein the outlet apertures are arranged in two parallel rows.

13. The patch panel defined in claim 8, wherein the bezel includes guides that extend rearwardly therefrom.

14. The patch panel defined in claim 8, wherein each of the plug apertures includes a plug latch recess on a side edge thereof.

15. A patch panel configured for mounting to a network rack, comprising:

a frame the patch panel including mounting features at opposite lateral ends for mounting the patch panel to the network rack;

a bezel mounted to the patch panel, the bezel including a front face plate with a plurality of outlet apertures and top and bottom panels mounted to the face plate; and a plurality of communication outlets mounted in respective ones of the outlet apertures, each of the outlets including a plurality of electrical contacts within a plug aperture configured to receive a mating plug, the plug aperture having a generally horizontal axis for receiving the mating plug and further including a plug latch recess, the outlets being oriented such that the plug latch recess is positioned on one side edge of the plug aperture and such that the horizontal axis of each plug aperture extends at an oblique angle away from its respective plug aperture when the patch panel is mounted on the network rack, and wherein the top and bottom panels of the bezel include notches that receive therein portions of the outlets.

16. The patch panel defined in claim 15, wherein each outlet includes a jack frame having a side wall with a beveled surface.

17. The patch panel defined in claim 15, wherein each outlet aperture includes an engagement recess on top and bottom edges thereof, and wherein each outlet includes engaging members that engage the engagement recesses.

18. The patch panel defined in claim 15, wherein the outlet apertures are arranged in two parallel rows.

19. The patch panel defined in claim 15, wherein the bezel includes guides that extend rearwardly therefrom.

20. A patch panel configured for mounting to a network rack, comprising:

a frame including mounting features at opposite lateral ends for mounting the patch panel to the network rack;

a bezel mounted to the patch panel, the bezel including a plurality of outlet apertures; and a plurality of communication outlets mounted in respective ones of the outlet apertures, each of the outlets including a plurality of electrical contacts within a plug aperture configured to receive a mating plug, the plug aperture having a generally horizontal axis for receiving the mating plug, the outlets being rotatable about a vertical axis between a forwardly-facing orientation and a forwardly- and laterally-facing orientation within the outlet aperture.

21. The patch panel defined in claim 20, wherein each plug aperture further includes a plug latch recess, and wherein the outlets are oriented such that the plug latch recess is positioned on one side edge of the plug aperture when the patch panel is mounted on the network rack.

22. The patch panel defined in claim 20, wherein each outlet includes a jack frame having a side wall with a beveled surface.

23. The patch panel defined in claim 20, wherein each outlet aperture includes an engagement recess on top and bottom edges thereof, and wherein each outlet includes engaging members that engage the engagement recesses.

24. The patch panel defined in claim 20, wherein the bezel includes top and bottom panels, and wherein each of the top and bottom panels includes notches configured to receive portions of the communication outlets.

25. The patch panel defined in claim 20, wherein the outlet apertures are arranged in two parallel rows.

26. The patch panel defined in claim 20, wherein the bezel includes guides that extend rearwardly therefrom.

\* \* \* \* \*